(12) United States Patent
Pan

(10) Patent No.: US 6,301,159 B1
(45) Date of Patent: Oct. 9, 2001

(54) 50% EXE TRACKING CIRCUIT

(75) Inventor: Feng Pan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/519,338

(22) Filed: Mar. 6, 2000

(51) Int. Cl.[7] .................................................. G11C 16/04
(52) U.S. Cl. .................. 365/185.3; 365/236; 365/189.12
(58) Field of Search ................................ 365/185.3, 240, 365/233, 236, 189.12, 230.02

(56) References Cited

U.S. PATENT DOCUMENTS

| | | | |
|---|---|---|---|
| 5,235,699 | * | 8/1993 | Shaffer et al. ........................ 395/550 |
| 5,542,109 | * | 7/1996 | Blomgren et al. .................... 395/800 |
| 5,557,334 | * | 9/1996 | Legate ................................... 348/473 |
| 5,991,517 | * | 11/1999 | Harari et al. ..................... 395/182.01 |

* cited by examiner

Primary Examiner—David Nelms
Assistant Examiner—Thong Le
(74) Attorney, Agent, or Firm—Davis Chin

(57) ABSTRACT

A tracking circuit is provided for performing an erase verify/erase operation so as to prevent over-erasure in an array of EEPROM memory cells. A binary counter is used to count the number of erase pulses during a normal erase verify/erase operation. Counter registers are used to store 50%, 25%, and 12.5% of a diagonal erase pulse count obtained from the binary counter during a diagonal erase verify operation. A multiplexer selectively pre-loads a target count prior to the normal erase verify/erase operation. A comparator circuit compares a pulse count during the normal erase verify/erase operation with the 50% of the diagonal erase pulse count and generates a high logic signal when the pulse count equals the 50% diagonal erase pulse count to indicate that the target has been reached. The target count may be varied by the multiplexer to be 25%, 37.5%, 50%, 62.5%, or 75% of the diagonal erase pulse count.

18 Claims, 7 Drawing Sheets

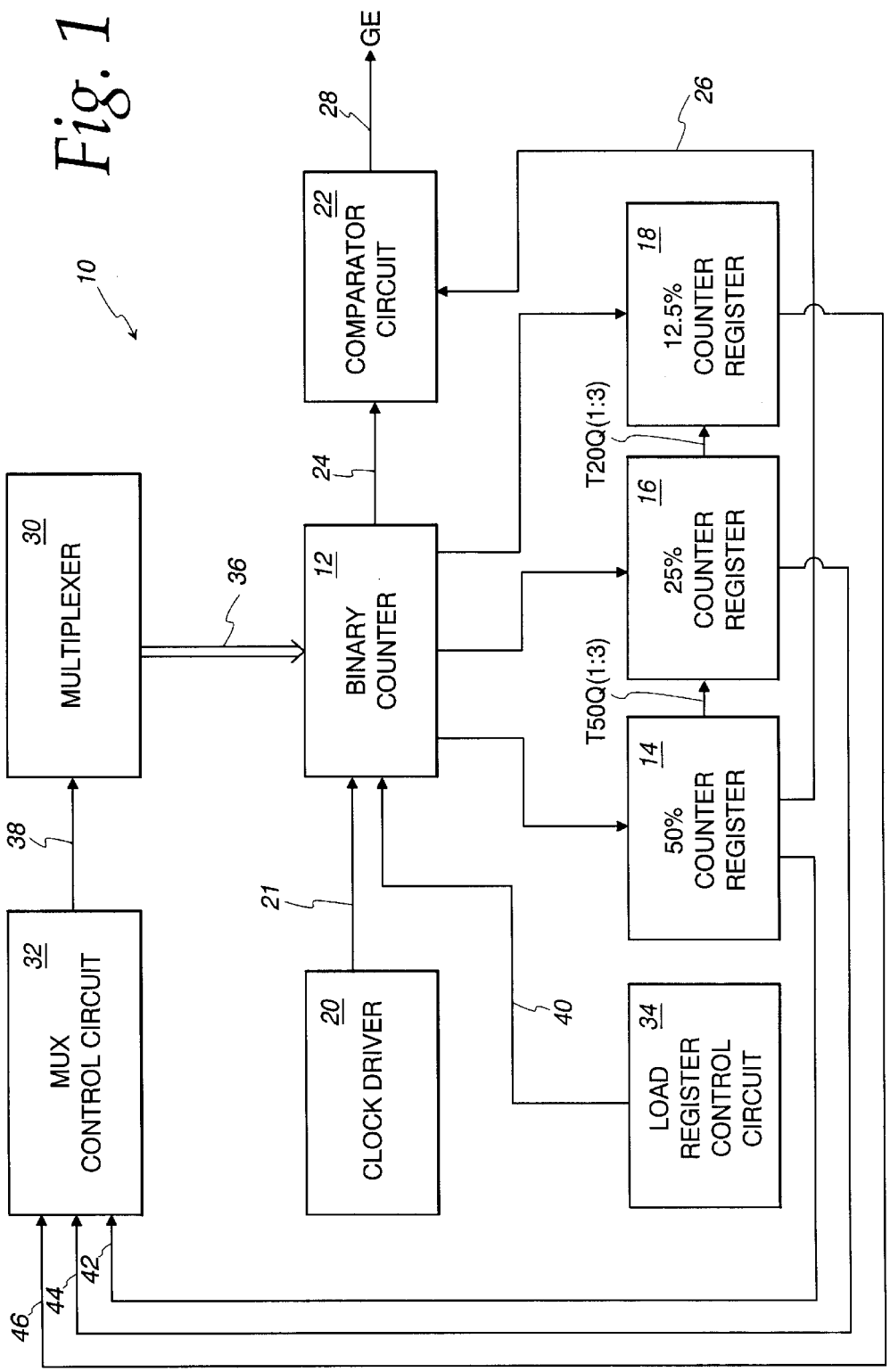

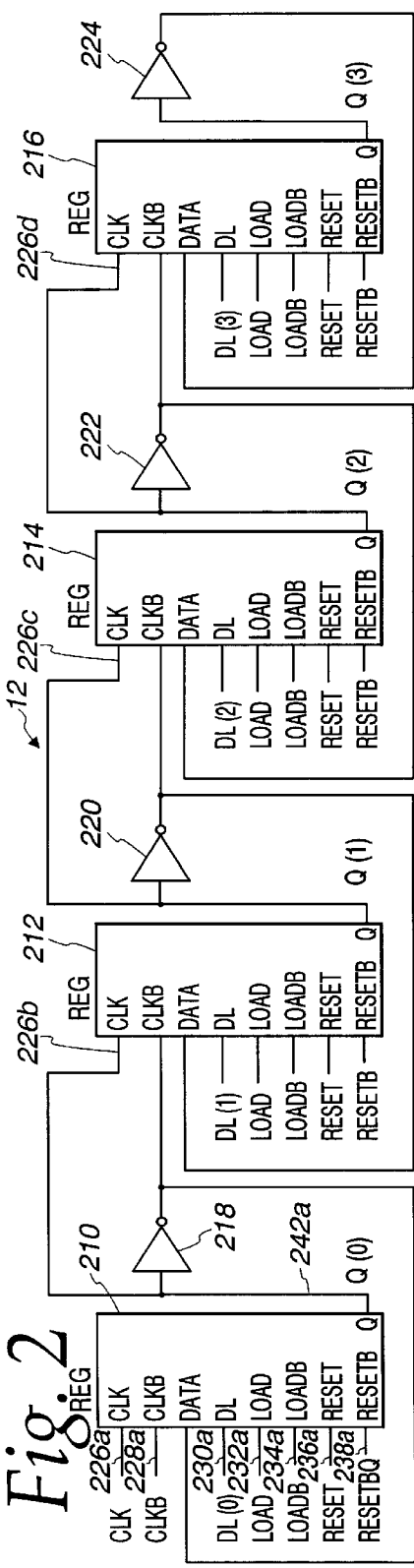
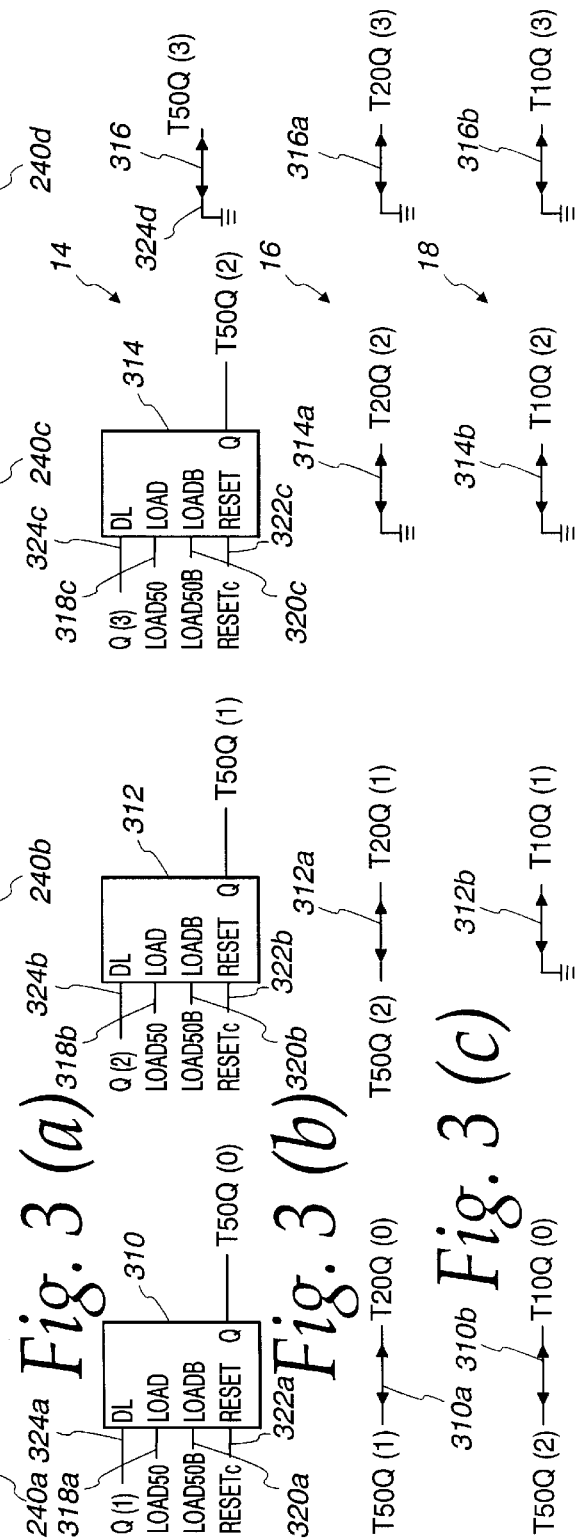

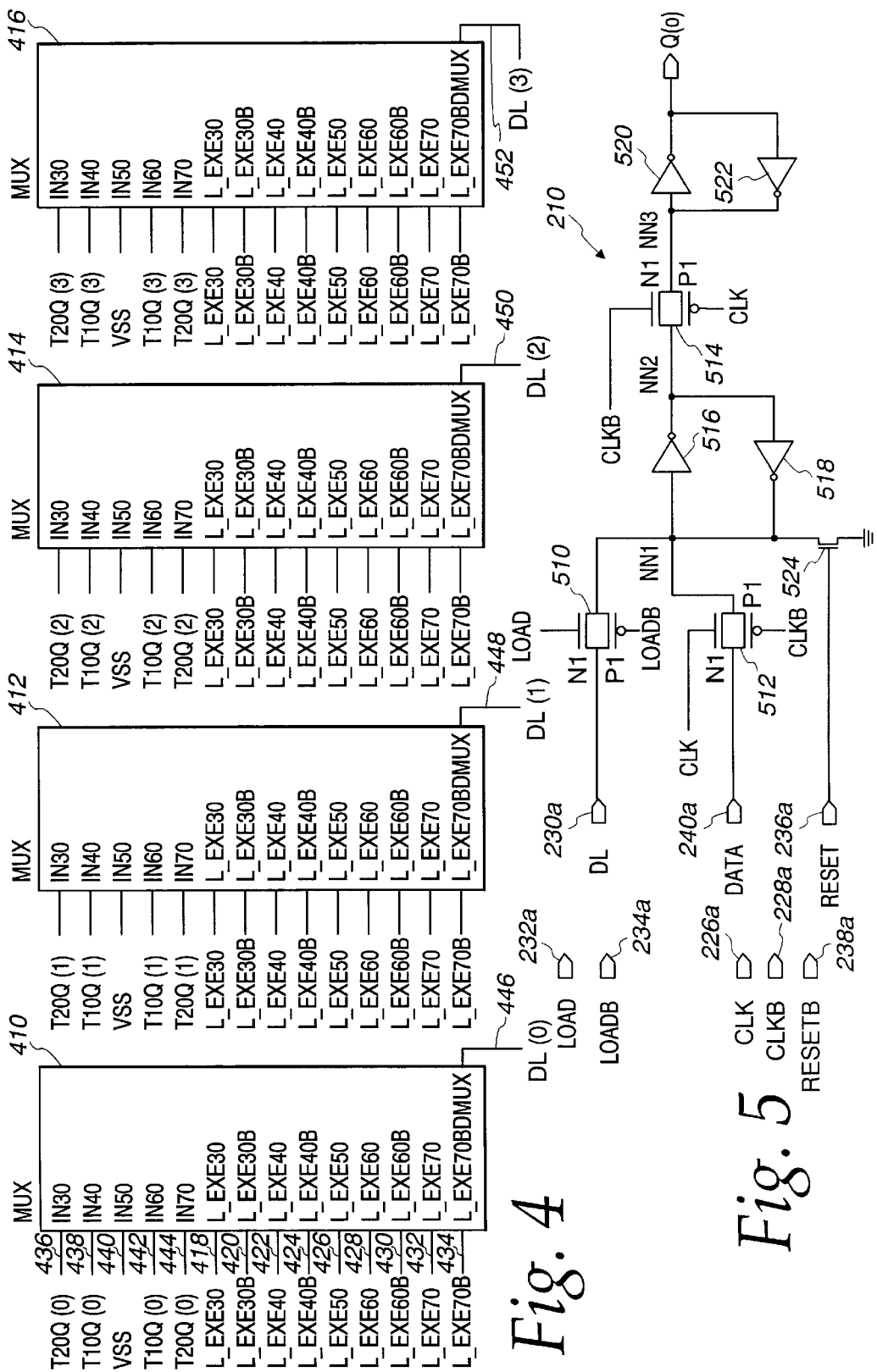

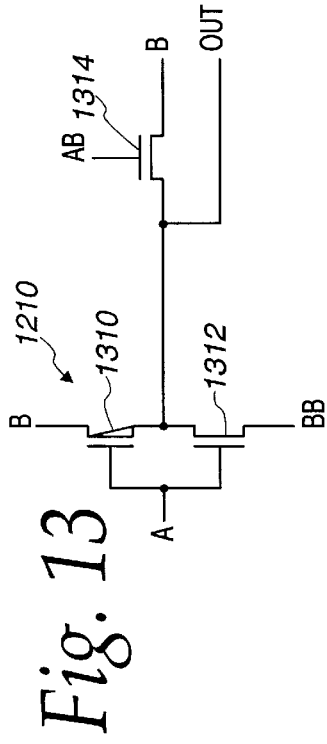
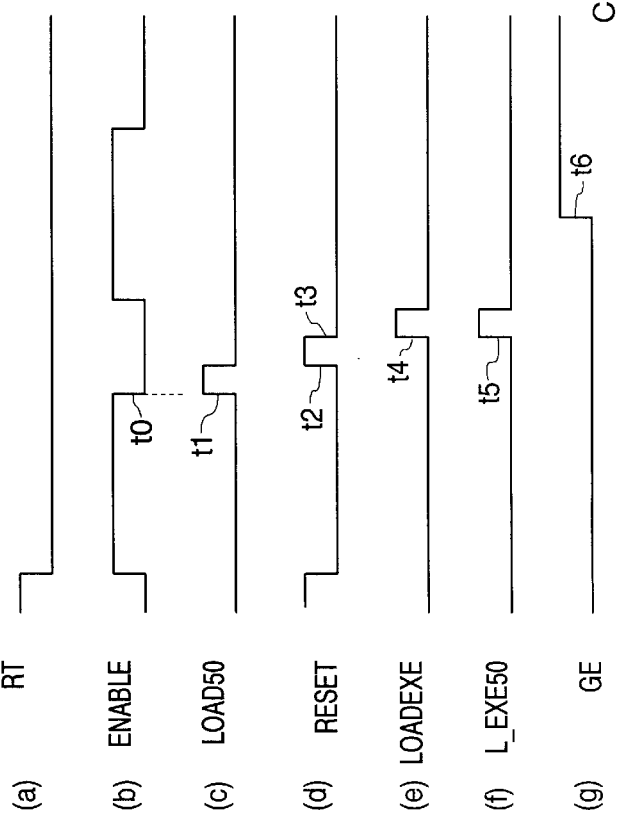

50% EXE TRACKING CIRCUIT

BACKGROUND OF THE INVENTION

This invention relates generally to floating gate memory devices such as an array of Flash electrically, erasable programmable read-only memory (EEPROM) cells. More particularly, the present invention relates to a tracking circuit and a method for use in an array of Flash EEPROM memory cells for performing an erase verify/erase operation so as to prevent an over-erasure problem.

As is generally well known in the art, electrical programmable and erasable memory array devices using a floating gate for the storage of charges thereon (Flash EPROMs/EEPROMs) have emerged in recent years. In a conventional EEPROM memory device, a plurality of one-transistor memory cells may be formed on a semiconductor substrate in which each cell is comprised of a P-type conductivity substrate, an N-type conductivity source region formed integrally within the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the EEPROM cell, the drain region and the control gate are raised to predetermined potentials above the potential applied to the source region. For example, the drain region has applied thereto a voltage of approximately +5.0 volts with the control gate having a voltage of approximately +8.5 volts applied. These voltages produce "hot electrons" which are accelerated across the thin dielectric layer and onto the floating gate. This hot electron injection results in an increase of the threshold of the device by approximately two to four volts.

In order to erase the EEPROM cell, a relatively high positive potential (e.g., +5.0 volts) is applied to the source region. The control gate has applied thereto a negative voltage of −8.5 volts, and the drain region is allowed to float. A strong electric field develops between the floating gate and the source region, and negative charges are extracted from the floating gate to the source region by way of Fowler-Norheim tunneling.

In order to determine whether the EEPROM cell has been programmed or not, the magnitude of the read current is measured. Typically, in the read mode of operation, the source region is held at a ground potential and the control gate is held at a potential of about +4.2 volts. The drain region is held at a potential between 1 to 2 volts. Under these conditions, an unprogrammed or erased cell (storing a logic "1") will conduct a predetermined amount of current. On the other hand, the programmed cell (storing a logic "0") will have considerably less current flowing.

In addition, prior to the conventional erasing mode of operation in the array of Flash EEPROM memory cells, all of the cells are initially programmed to zero. Then, an erase verify operation is performed to determine if there are any memory cells that need to be erased (e.g., memory cells having a programmed threshold level or logic "0"). If one or more cells are found to exist that require erasing, an erase pulse is applied using a negative gate erase in accordance with Fowler-Norheim tunneling so as to discharge the charges on the floating gate of the memory cells. Thereafter, another erase verify operation is performed to check that the memory cells have been erased. This cycle of erase verify, erase pulse, and erase verify is repeated over and over until all of the cells in a sector have been successfully erased.

Unfortunately, the erase pulse is applied not only to the memory cell or bit that requires erasing, but to all of the bits in the same sector. As a result, all of the bits in the same sector, even those bits that have passed the erase verify operation, will receive the erase pulse and thus will become over-erased. Therefore, even with the control gate being grounded the over-erased bit or cell will always be turned ON which causes column leakage so as to prevent the proper reading of another cell in the column of the array containing this cell as well as making programming of the other cells on the same column increasingly more difficult. Further, in view of the fact that all of the bits in the same sector will not have the same rate of erasure, it is generally desirable to be able to determine which ones are the "slow" bits which will require a longer time to be erased.

Accordingly, in order to identify those "slow" bits during production, a procedure is currently being used by production engineers and testers which is referred to as "diagonal erase verify." This diagonal erase verify procedure is very similar to the conventional erase verify operation, except that the erase verify operation is performed only on the bits residing along the diagonal line of the sector. The total number of erase pulses required to pass the diagonal erase verify procedure is maintained. While it is known that all of the bits along the diagonal line have passed the erase verify, it is still not known whether the other bits have passed.

It has been empirically determined that the remainder of the bits in the same sector should pass the conventional or normal erase verify operation when less than 50% of the total number of erase pulses required to pass the diagonal erase verify are applied to the sector. By limiting the total number of erase pulses applied to the same sector to be less than 50% of the diagonal erase pulses, then the problem of over-erasure will be avoided so as to prevent other problems during the reading, verifying and programming modes of operation. This diagonal erase verify is performed currently on a separate test fixture.

In order to simplify the production process, the inventor of the present invention has developed a way of implementing the same function on the same semiconductor integrated circuit containing the memory device. This is accomplished by the provision of a tracking circuit which limits the total number of erase pulses applied to the same sector to be less than 50% of the diagonal erase pulses. Since the percentage of 50% of the diagonal erase pulses is a number determined by experimental investigation, it would be expedient to be able to vary the percentage from approximately 30% to 70% of the total diagonal erase pulses.

SUMMARY OF THE INVENTION

Accordingly, it is a general object of the present invention to provide a tracking circuit and method for use in an array of Flash EEPROM memory cells which has been traditionally unavailable.

It is an object of the present invention to provide a tracking circuit and method for use in an array of Flash EEPROM memory cells for performing an erase verify/erase operation so as to prevent an over-erasure problem.

It is another object of the present invention to provide a tracking circuit for performing an erase verify/operation which includes a binary counter for counting a total number of erase pulses applied during a diagonal erase verify operation and is terminated when a predetermined percentage of the total number of erase pulses is reached during a normal erase verify/erase operation.

It is still another object of the present invention to provide a tracking circuit for performing an erase verify/erase operation so as to prevent an over-erasure problem which includes a binary counter, a counter register for storing a predetermined percentage of a diagonal erase pulse count, and a comparator circuit for comparing the count of the binary counter and the predetermined percentage of the counter register during a normal erase verify/erase operation and for generating a high logic signal when the pulse count equals the predetermined percentage.

In a preferred embodiment of the present invention, there is provided a tracking circuit for performing an erase verify/erase operation so as to prevent over-erasure in an array of Flash EEPROM memory cells. A binary counter is provided for counting clock pulses corresponding to the number of erase pulses during a normal erase verify/erase operation. A plurality of counter registers are used to store 50%, 25% and 12.5% of a diagonal pulse count corresponding to binary representations of the total number of the clock pulses obtained from the binary counter during a diagonal erase verify/erase operation.

A multiplexer circuit is used to selectively pre-load the binary counter with a binary representation corresponding to one of a number of target counts prior to the normal erase verify/erase operation. A comparator circuit responsive to the binary counter and the 50% counter register is used to compare a pulse count of the clock pulses obtained from the binary counter during the normal erase verify/erase operation and the 50% of the diagonal pulse count from the counter register and for generating a high logic signal when the pulse count equals 50% of the diagonal pulse count so as to indicate that the corresponding one of a number of target counts has been reached.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a block diagram of a tracking circuit, constructed in accordance with the principles of the present invention;

FIG. 2 is a block diagram of the binary counter 12 of FIG. 1;

FIG. 3(a) is a block diagram of the 50% counter register 14 of FIG. 1;

FIG. 3(b) is a block diagram of the 25% counter register 16 of FIG. 1;

FIG. 3(c) is a block diagram of the 12.5% counter register 18 of FIG. 1;

FIG. 4 is a block diagram of the multiplexer 30 of FIG. 1;

FIG. 5 is a schematic circuit diagram of a register 210 for use in the binary counter 12 of FIG. 2;

Figures 6, 7, 8:
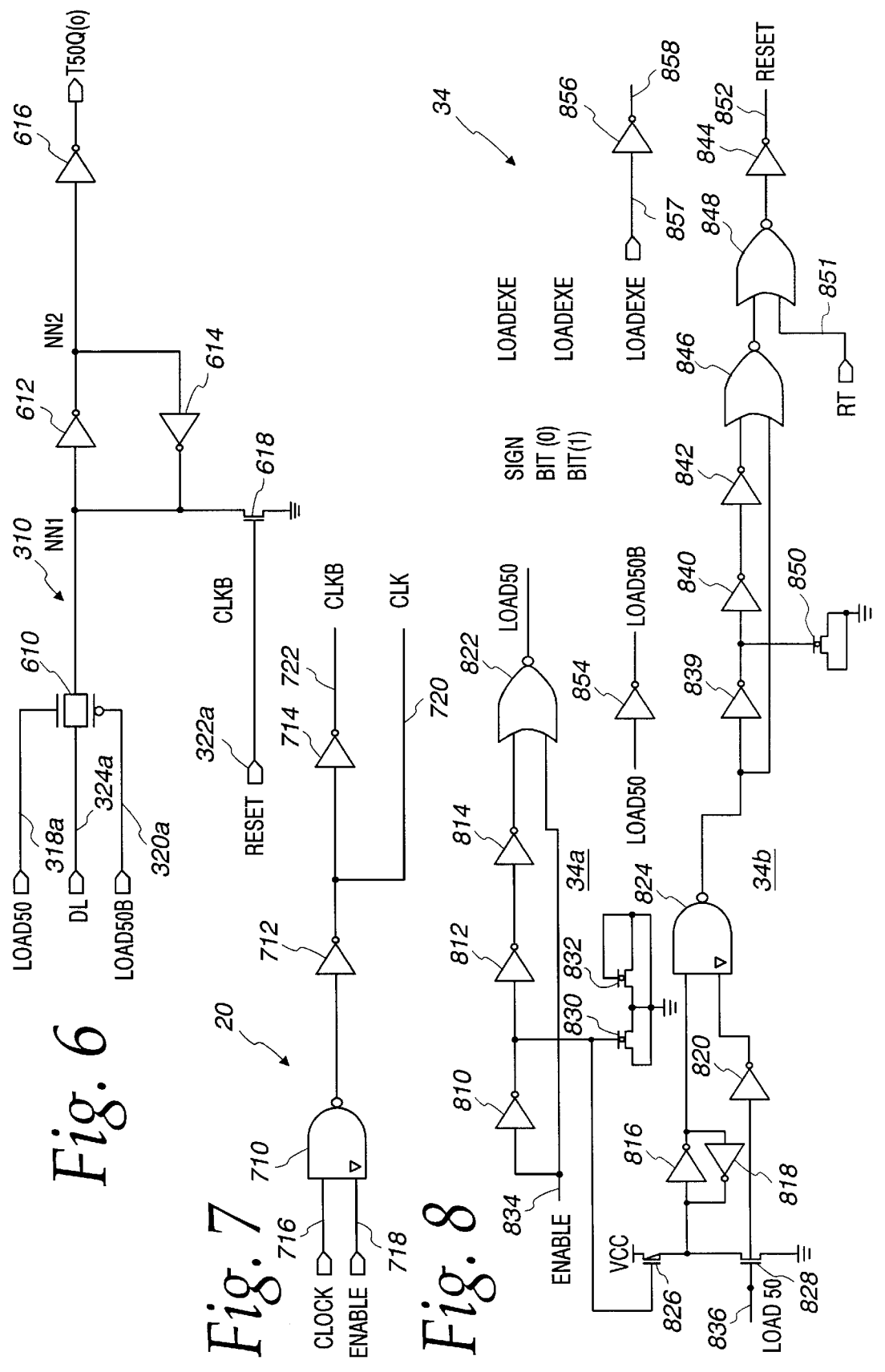

FIG. 6 is a schematic circuit diagram of a latch 310 for use in the 50% counter register 14 of FIG. 3(a);

FIG. 7 is a schematic circuit diagram of the clock driver 20 of FIG. 1;

FIG. 8 is a schematic circuit diagram of the load register control circuit 34 of FIG. 1;

FIG. 12 is a schematic circuit diagram of the compare circuit 1126 of FIG. 11;

FIG. 13 is a schematic circuit diagram of the exclusive OR 1210 for use in the compare circuit of FIG. 12; and FIGS. 14(a)–14(g) are waveforms indicating the state of various signals, useful in understanding the operation of the present invention.

DESCRIPTION OF THE PREFERRED EMBODIMENT

Figure 9:
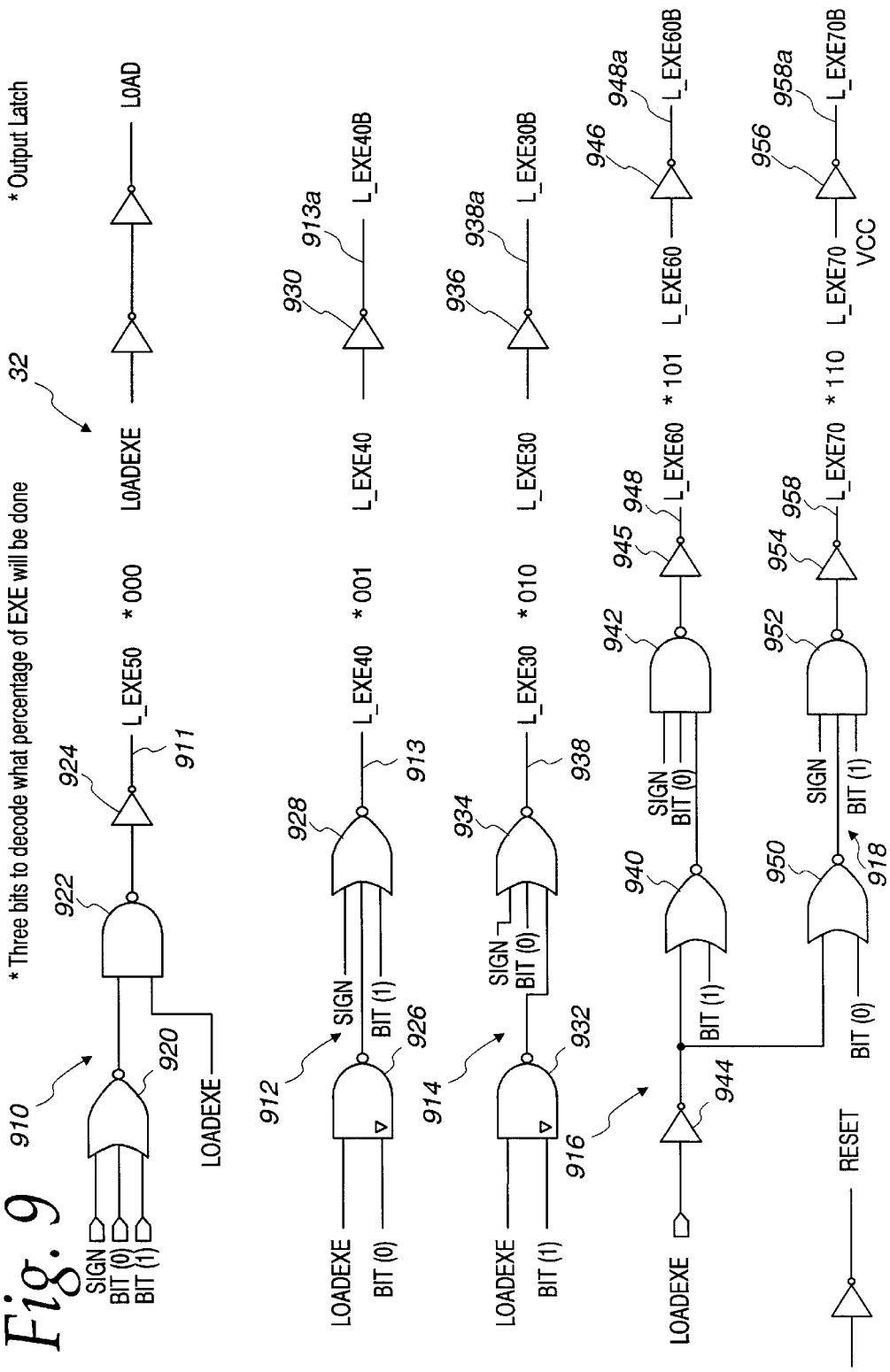
FIG. 9 is a schematic circuit diagram of the mux control circuit 32 of FIG. 1.

A tracking circuit for performing an erase verify/erase operation so as to prevent an over-erasure problem in an array of Flash EEPROM memory cells is described. In the following description, numerous specific details are set forth, such as specific circuit configurations, components, and the like in order to provide a thorough understanding of the present invention. However, it should be apparent to those skilled in the art that the present invention may be practiced without these specific details. In other instances, well-known processes, circuits, and control lines, not particularly relevant to the understanding of the operating principles of the present invention, have been purposely omitted for the sake of clarity.

Referring now in detail to the drawings, there is shown in FIG. 1 a block diagram of a tracking circuit 10 for use in an array of Flash EEPROM memory cells so as to prevent the problem of over-erasure, constructed in accordance with the principles of the present invention. The tracking circuit 10 of the present invention keeps track of the total number of erase pulses applied to pass a diagonal erase verify/erase operation, which is referred to as a diagonal erase pulse count. Thereafter, the number of erase pulses applied to the same sector during a normal erase verify/erase operation is limited to a predetermined percentage of the diagonal erase pulse count. While this predetermined percentage is preferably selected to be 50% of the diagonal erase pulse count, this percentage could be varied approximately ±10% or ±20% from the 50% in actual practice depending upon the results of test studies. Thus, the tracking circuit 10 includes a multiplexer for selectively pre-loading a binary counter with a binary representation corresponding to one of a plurality of target counts (25%, 37.5%, 50%, 62.5%, or 75% of the diagonal erase pulse count) prior to the normal erase verify operation. The tracking circuit is wholly formed on the same semiconductor integrated circuit which is used to fabricate the EEPROM memory device.

The tracking circuit 10 includes a binary counter 12, a 50% counter register 14, a 25% counter register 16, a 12.5% counter register 18, a clock driver 20, and a comparator circuit 22. During the diagonal erase verify mode of operation, each time an erase pulse is applied to the sector, the clock driver 20 will issue a clock pulse. The clock pulses from the clock driver 20 on line 21 will be counted by the binary counter 12 so as to keep track of the total number of erase pulses (diagonal erase pulse count) required to pass the diagonal erase verify operation. The binary counter will then be reset and will be pre-loaded with a predetermined number at which to begin counting from during the normal erase verify/erase operation.

However, prior to resetting of the binary counter, 50% of the diagonal erase pulse count will be transferred and stored in the 50% counter register 14. Similarly, 25% of the diagonal erase pulse count will be transferred and stored in the 25% counter register 16 and 12.5% of the diagonal erase pulse count will be transferred and stored in the 12.5% counter register 18. During the normal erase verify/erase operation, the pre-loaded binary counter will again count the clock pulses from the clock driver 20 and the comparator circuit 22 will compare the normal pulse count on line 24 (outputs of the binary counter 12) with the stored 50% of the diagonal erase pulse count on line 26 (outputs of the counter register 14). When the normal pulse count equals the stored 50% of the diagonal erase pulse count, the output of the comparator circuit 22 on line 28 will provide a high logic signal (GE).

The tracking circuit 10 further includes a multiplexer 30, a mux control circuit 32, and a load register count control circuit 34. After the diagonal erase verify operation and before the normal erase verify/erase operation, the outputs of the multiplexer 30 on line 36 will be multiplexed and loaded into the binary counter 12. In other words, depending upon the load mux control signals on line 38 from the mux control circuit 32, a binary representation corresponding to one of a number of target counts (either 25%, 37.5%, 50%, 62.5% or 75% of the diagonal erase pulse count) will be loaded into the binary counter 12. The mux control circuit 32 receives either 0%, 25%, or 12.5% of the diagonal erase pulse count from the counter registers 16–18 via respective lines 44 and 46. After the diagonal erase verify operation, the load register control circuit 34 will generate a load register signal on line 40 so as to cause 50% of the pulse count from the binary counter to be loaded into the 50% counter register 14, to cause 25% of the pulse count from the binary counter 12 to be loaded into the 25% counter register 16, and to cause 12.5% of the pulse count from the binary counter to be loaded into the 12.5% counter register 18. Finally, the control circuit 34 will produce a reset signal so as to reset the outputs of the binary counter to zero.

While the various blocks 12, 14, 16, 18, 20, 22, 30, 32 and 34 of FIG. 1 may take on various forms, suitable circuitry therefor are illustrated in the respective FIGS. 3 through 13. Even though these block diagrams or schematic circuit diagrams are believed to be self-explanatory to those skilled in the art in view of the foregoing description, a brief description of the operation of each is believed to be in order.

In FIG. 2, there is shown a block diagram of the binary counter 12 of FIG. 1. It should be appreciated that the binary counter 12 is illustrated as a four-bit binary counter for ease of explanation only and that a binary counter having any number of bits may be used so as to count to the desired number. The binary counter 12 is formed of four registers 210, 212, 214 and 216 and four inverters 218, 220, 222 and 224. The first register 210 receives as its inputs true and complementary clock signals CLK and CLKB on respective lines 226a, 228a from the clock driver 20 (FIG. 7); the multiplexer output signal DL(0) on line 230a from the multiplexer 30 (FIG. 4); the true and complementary load signal LOAD and LOADB on respective lines 232a, 234a; true and complementary reset signals RESET and RESETB on respective lines 236a, 238a from the load register control circuit 34 (FIG. 8); and a data signal DATA on line 240a from the output of the inverter 218. The first register 210 produces an output signal Q(0) on line 242a. The second register 212 receives substantially the same input signals on the respective lines 226b–240b as the first register 210, except that the signals on the lines 226b, 228b are from the output and its complement of the first register 210; the signal on the line 230b is the multiplexer output signal DL(1) from the multiplexer 30; and the data signal on the line 240b is from the output of the inverter 220.

Similarly, the third register 214 and the fourth register 216 also receive substantially the same input signals on respective lines 226c–240c, 226d–240d to the ones received by the second register 212. The first register 210 is used to store the least significant bit (LSB) and the fourth register 216 is used to store the most significant bit (MSB).

Since the first through fourth registers 210–216 are identical in their construction and operation, it will be sufficient to illustrate and discuss the details of only the first register 210 of FIG. 2. In FIG. 5, there is shown a detailed schematic circuit diagram of the first register 210. The first register 210 includes three transmission gates 510, 512, 514; four inverters 516, 518, 520, 522 and an NMOS transistor 524. Each of the transmission gates 510, 512 and 514 is formed of a PMOS transistor P1 and an NMOS transistor N1 whose conduction electrodes are connected to form a path when their control gates are activated. The output of the inverter 516 is connected to the input of the inverter 518, and the output of the inverter 518 is connected to the input of the inverter 516. Similarly, the output of the inverter 520 defining the output Q(0) of the first register 210 is connected to the input of the inverter 522, and the output of the inverter 522 is connected to the input of the inverter 520.

In FIG. 3(a), there is shown a block diagram of the 50% counter register 14 of FIG. 1. The counter register 14 is formed by four latches 310, 312, 314 and 316. The latches 310–316 receive as their input signals the true and complementary load register control signals LOAD50, LOAD50B from the load register control circuit 34 and the reset signal RESET on respective lines 318a, 320a, 322a, through 318c, 320c, 322c. Since the counter register 14 is used to store 50% of the diagonal erase pulse count from the binary counter 12, this can be easily obtained by shifting the outputs Q(0)–Q(3) of the binary counter one bit to the left or towards the LSB and setting the MSB to zero and then loading the results into the latches.

For example, if the diagonal erase pulse count from the respective outputs of the binary counter is (LSB→MSB: 1011), then by left shifting one bit to the LSB, there is obtained (LSB→MSB: 0110). In other words, the output Q(1) from the binary counter is fed to input line 324a of the latch 310; the output Q(2) is fed to input line 324b of the latch 312; and the output Q(3) is fed to input line 324 of the latch 314. As can be seen, the latch 316 is set to zero by connecting the input line 324d to ground. Further, it will be noted that the output signals from the latches 310–316 are defined by T50Q(0), T50Q(1), TF0Q(2) and T50Q(3) respectively and will be storing 0110.

In FIG. 3(b), there is shown a block diagram of the 25% counter register 16 of FIG. 1. The counter register 16 is formed by four latches 310a–316a. However, since the counter register 16 is used to store 25% of the diagonal erase pulse count from the binary counter, this can be easily obtained by shifting the outputs Q(0)–Q(3) of the binary counter two bits to the left and setting the two MSB to zero. For example, if the diagonal erase pulse count from the respective outputs of the binary counter is LSB→MSB: 1011, then by left shifting two bits, there is obtained LSB→MSB: 1100 which are loaded into the latches 310a–316a. Alternatively, the output T20Q(0) of the latch 310a is obtained from the output T50Q(1) of the latch 312, and the output T20Q(1) of the latch 312a is obtained from the output T50Q(2) of the latch 314.

In FIG. 3(c), there is shown a block diagram of the 12.5% counter register 18 of FIG. 1. The counter register 18 is formed by four latches 310b–316b. However, since the counter register 18 is used to store 12.5% of the diagonal erase pulse from the binary counter, this can be easily obtained by shifting the outputs Q(0)–Q(3) of the binary counter three bits to the left and setting the three MSB to zero. For example, if the diagonal pulse count from the respective outputs of the binary counter is LSB→MSB: 1011, then by left shifting three bits, there is obtained LSB→MSB: 1000. Alternatively, the output T10Q(0) of the latch 310b is obtained from the output T20Q(1) of the latch 312a.

Since all of the latches are identical in their construction and operation, it will be sufficient to illustrate and discuss the details of the latch 310 of FIG. 3(a). In FIG. 6, there is shown a detailed schematic circuit diagram of the latch 310. The latch 310 includes a transmission gate 610; inverters 612, 614, 616; and an NMOS transistor 618. The output of the inverter 612 is connected to the inputs of the inverters 614 and 616, and the output of the inverter 614 is connected to the input of the inverter 612. The output (Q) of the inverter 616 defines the output of the latch 310.

In FIG. 4, there is shown a block diagram of the multiplexer 30 of FIG. 1. The multiplexer includes four mux circuits 410, 412, 414 and 416. Each of the mux circuits receive true and complementary load execute signals L_EXE30, L_EXE30B through L_EXE70, L_EXE70B on respective lines 418 through 434. Further, each mux circuit receives the corresponding output bits from the respective counter registers 14, 16 and 18 on associated input lines 436–444. The mux circuits 410–416 produce the respective output signals DL(0)–DL(3) on output lines 446–452, which are fed to the input lines 230a–230d of the binary counter (FIG. 2).

Figure 10:
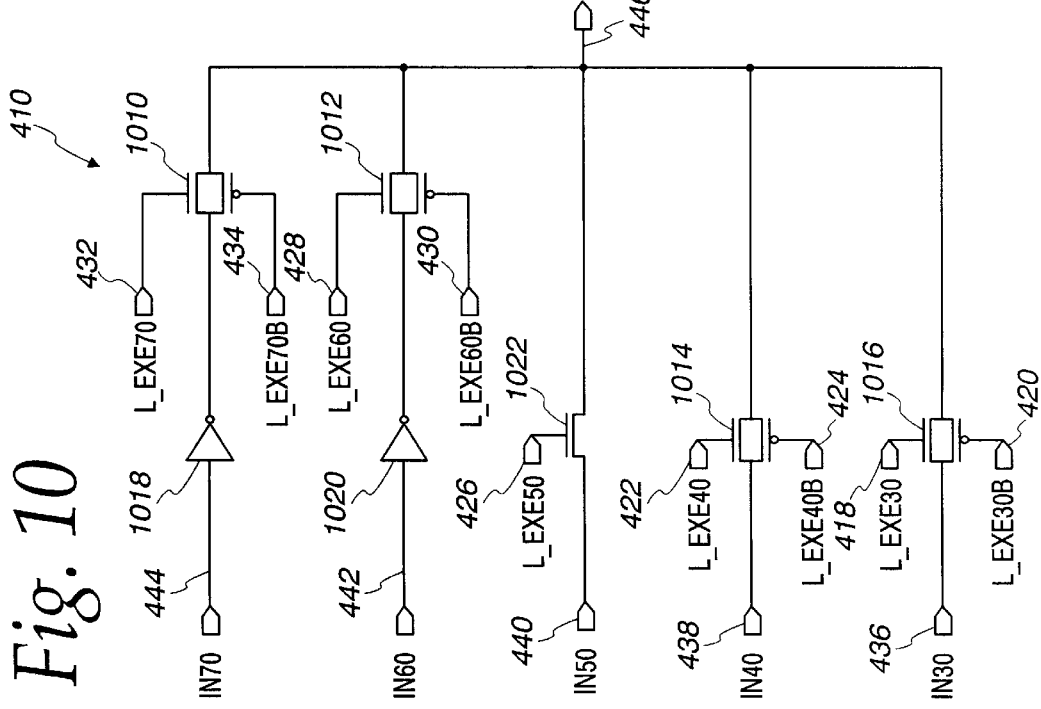
FIG. 10 is a schematic circuit diagram of a mux circuit 410 for use in the multiplexer 30 of FIG. 4.

Since the four mux circuits 410–416 are identical in their construction and operation, it will be sufficient to show and discuss the details of the mux circuit 410 of FIG. 4. In FIG. 10, there is shown a detailed schematic circuit diagram of the mux circuit 410. The mux circuit 410 includes transmission gates 1010, 1012, 1014, 1016; inverters 1018, 1020; and an NMOS transistor 1022. Each of the transmission gates is formed of a PMOS transistor and an NMOS transistor. The inverters 1018 and 1020 are used to invert the bits from the counter registers in order to provide a negative percentage (2's complement).

Figure 11:
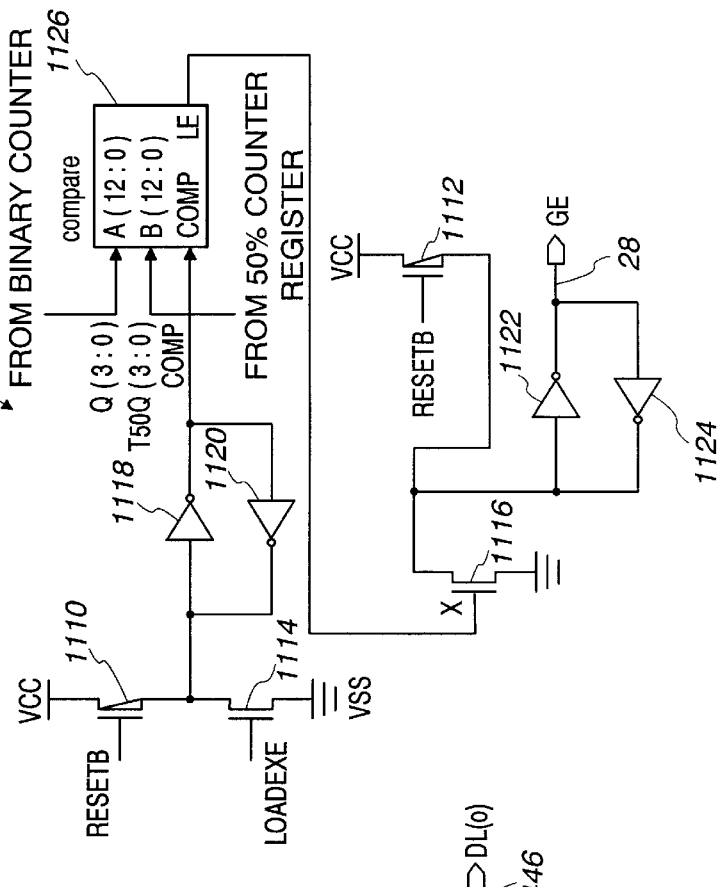
FIG. 11 is a schematic circuit diagram of the comparator circuit 22 of FIG. 1.

In FIG. 11, there is shown a schematic circuit diagram of the comparator circuit 22 of FIG. 1. The comparator circuit 22 includes PMOS transistors 1110, 1112; NMOS transistors 1114, 1116; inverters 1118–1124; and a compare circuit 1126. The transistors 1110 and 1114 are interconnected in series between a supply potential VCC and a ground potential VSS. The gate of the PMOS transistor 1110 is connected to receive the complement reset signal RESETB, and the gate of the NMOS transistor 1114 is connected to receive the load execute signal LOADEXE. The junction of the transistors 1110, 1114 is connected to the input of a first latch formed by inverters 1118 and 1120. The output of the first latch produces an output signal COMPARE which is fed to the compare circuit 1126. The transistors 1112 and 1116 are also interconnected in series between the supply potential VCC and the ground potential VSS. The gate of the transistor 1112 is also connected to receive the complement reset signal RESETB, and the gate of the transistor 1116 is connected to receive the output signal LE from the compare circuit 1126. The junction of the transistors 1112, 1116 is connected to the input of a second latch formed by the inverters 1122 and 1124. The output of the comparator circuit 22 provides a logic signal GE on the line 28. The compare circuit 1126 receives input signals on the line 24 from the binary counter and on the line 26 from the 50% counter register 14.

In FIG. 12, there is depicted a schematic circuit diagram of the compare circuit 1126 of FIG. 11. The compare circuit 1126 includes a plurality of exclusive "OR" gates 1210, 1212, 1214, 1216, 1218; NOR gates 1220, 1222; a NAND gate 1224; and an inverter 1225. The NOR gate 1220 receives the outputs of the exclusive "OR" gates 1210, 1212 and 1214 and its output is fed to an input of the NAND gate 1224. Similarly, the NOR gate 1222 receives the outputs from the exclusive "OR" gates 1216 and 1218 and has its outputs fed to another input of the NAND gate 1224. The output of the NAND gate 1224 is fed to the input of the inverter 1225 whose output defines the output of the compare circuit 1126.

Since all of the exclusive "OR" gates 1210–1218 are identical in their construction and operation, it will be sufficient to show and discuss the details of the exclusive "OR" gate 1210 of FIG. 12. In FIG. 13, there is shown a detailed schematic circuit diagram of the exclusive "OR" 1210. The gate 1210 is formed by transistors 1310, 1312 and 1314 and inverters 1316, 11318. The gates of the transistors 1310 and 1312 are connected together to receive the true signal A. The source of the transistor 1310 is connected to receive the true signal B, and the source of the transistor 1312 is connected to receive the complement signal BB. The drains of the transistors 1310 and 1312 are connected together and to the drain of the transistor 1314 so as to provide the output signal OUT. The gate of the transistor 1314 is connected to receive the complement signal AB, and the source of the transistor 1314 is connected to receive the true signal B. The outputs of the inverters 1316 and 1318 are used to provide the respective complementary signals BB and AB.

In FIG. 7, there is depicted a schematic circuit diagram of the clock driver 20 of FIG. 1. The clock driver includes a NAND gate 710 and inverters 712, 714. The NAND gate 710 has a first input on line 716 for receiving a true input clock signal CLOCK and a second input on line 718 for receiving an input enable signal ENABLE. The input of the inverter 712 is connected to the output of the NAND gate 710. The output of the inverter 712 provides and output signal CLK on line 720. The input of the inverter 714 is connected also to the output of the inverter 712 and the output thereof provides a complementary output signal CLKB on line 722.

In FIG. 8, there is depicted a schematic circuit diagram of the load register control circuit 34 of FIG. 1. The load register control circuit 34 is formed of a load50 circuit portion 34a and a reset circuit portion 34b. The load50 circuit portion 34a includes inverters 810, 812, 814, 816, 820; NOR gate 822; NAND gate 824; and transistors 826, 828, 830, 832. The circuit portion 34a receives the input signal ENABLE on line 834 and a signal load50 on line 836. The circuit portion 34a generates an output signal LOAD50 on line 838. The reset circuit portion 34b includes inverters 839, 840, 842, 844; NOR gate 846 and a transistor 850. The reset circuit portion 34b receives the output from the NAND gate 824 of the circuit portion 34a as a first input and receives a second input signal RT (global reset) on line 851. The output of the circuit portion 34b is on line 852 which generates the reset signal RESET. It will be noted that load register signal LOAD50 is also inverted by an inverter 854 to produce the load register signal LOAD50B. An inverter 856 receives the signal LOADEXE on line 857 and produces the complement signal LOADEXEB on line 858.

In FIG. 9, there is shown a schematic circuit diagram of the mux control circuit 32 of FIG. 1. The mux control circuit 32 includes decoder circuits 910, 912, 914, 916, 918 for decoding a three-bit code (i.e., SIGN, BIT(0), BIT(1)) so as to determine what percentage of the diagonal erase pulse count will be caused to be loaded into the binary counter by the multiplexer 30. The decoder circuit 910 includes NOR gate 920, NAND gate 922, and an inverter 924. The decoder circuit 910 will generate a high logic signal L__EXE50 on line 911 when the three-bit code equals 000. The decoder circuit 912 includes NAND gate 926, NOR gate 928, and inverter 930. The decoder circuit 912 will generate a high logic signal L__EXE40 on line 913 when the three-bit code is equal to 001 and its complement L__EXE40B on line 913a. The decoder circuit 914 includes NAND gate 932, NOR gate 934, and inverter 936. The decoder circuit 914 will generate a high logic signal L__EXE30 on line 938 when the three-bit code is equal to 010 and its complement L__EXE30B on line 938a. The decoder circuit 916 includes NOR gate 940, NAND gate 942, and inverters 944, 945, 946. The decoder circuit will generate a high logic signal L__EXE60 on line 948 when the three-bit code is equal to 101 and its complement L__EXE60B on line 948a. The decoder circuit 918 includes NOR gate 950, NAND gate 952, and inverters 954, 956. The decoder circuit 918 will generate a high logic signal L__EXE70 on line 958 when the three-bit code equals 110 and its complement L__EXE70B on line 958a.

The operation of the tracking circuit 10 depicted in the block diagram of FIGS. 1 through 4 and in the detailed schematic circuit diagrams of FIGS. 5 through 13 will now be explained with reference to the waveforms in FIGS. 14(a)–14(g). Initially, it will be assumed that the diagonal erase verify operation has been performed on all of the bits residing on the diagonal line of a sector. In this manner, there is obtained a total count of the number of erase pulses (diagonal erase pulsed count) required to pass the diagonal erase verify. Further, it is assumed that the diagonal erase pulse count is one hundred and its binary representation is being held at the Q(0) . . . Q(n) outputs (FIG. 2) of the binary counter 12. In the present case, it is assumed that to prevent over-erasure the number of erase pulses applied during the normal erase verify/erase operation is to be limited to 50% of the diagonal erase pulse count.

Also, prior to time t0 it is assumed that the Global reset signal RT is at a low logic level as shown in FIG. 14(a), and that the enable signal ENABLE as shown in FIG. 14(b) is at a high logic level. When the enable signal ENABLE goes low at the time t0, the load register signal LOAD50 as depicted in FIG. 14(c) from the control circuit 34 (FIG. 8) will go high at the time t1 so as to cause the binary representation of fifty to be loaded into the 50% counter register 14. In addition, the binary representation of twenty-five will be shifted into the 25% counter register 16, and the binary representation of twelve (the 0.5 being dropped) will be shifted into the 12.5% counter register 18.

After the counter registers 14, 16 and 18 have been loaded, a reset pulse is generated at time t2 when the load register signal LOAD50 goes low. This is illustrated in FIG. 14(d). The reset signal will cause the outputs of the binary counter to be reset to zero. When the reset signal goes low at time t3, dependent upon the percent of diagonal erase pulse count selected as the target count (25%, 37.5%, 50%, 62.5%, 75%) the load signal LOADEXE as shown in FIG. 14(e) and one of the load execution signals L__EXE50, L__EXE40, L__EXE30, L__EXE60, and L__EXE70 will be pulsed at the respective times t4 and t5, as shown in FIGS. 14(e) and 14(f).

If it is desired to limit the number of erase pulses applied during the normal erase verify/erase operation, to 50% of the diagonal erase pulse count (target count of 50%), then the three-bit code will be set to "000" in the mux control circuit 32 so as to cause only the load execution signal L__EXE50 to go high at the time t5. As a result, the outputs of the multiplexer 30 will be set to "0". These outputs of the multiplexer will be pre-loaded into the inputs DL of the binary counter 12. When the binary counter 12 is activated to start counting during the normal erase verify/erase operation, it will start counting from "0". The comparator circuit 22 will compare the pulse count from the outputs of the binary counter with the outputs of the 50% counter register 14. When the pulse count from the binary counter 12 is equal to the outputs of the 50% counter register 14, the logic signal GE on the line 28 will go high indicating that the target count has been reached. Among other things, the logic signal GE may be used to signal a state machine(not shown) so as to prevent the application of additional erase pulses to the memory cells in the sector.

Similarly, if it is desired to limit the number of erase pulses applied during the normal erase verify/erase operation to 37.5% of the diagonal erase pulse count, then the three-bit code will be set to "001" in the mux control circuit 32 so as to cause only the load execute signal L__EXE40 to go high. As a consequence, the mux control circuit will cause 12.5% of the diagonal erase pulse count (outputs of the counter register 18) to be sent to the outputs of the multiplexer 30. These outputs of the multiplexer are again pre-loaded into the inputs of the binary counter. When the binary counter is activated this time, it will start counting from a binary representation of 12.5% of the diagonal erase pulse count and then is compared with the output of the 50% counter register 14 by the comparator circuit 22. When the logic signal GE goes high, the actual count will only be 37.5% of the diagonal erase pulse.

Further, if it is desired to limit the number of erase pulses applied during the normal erase verify/erase operation to 25% of the diagonal erase pulse count, then the three-bit code will be set to "010" in the mux control circuit 32 so as to cause only the signal L__EXE30 to go high. As a result, the mux control circuit will cause 25% of the diagonal erase pulse count (outputs of the counter register 16) to be sent to the outputs of the multiplexer. These outputs of the multiplexer are again pre-loaded into the inputs of the binary counter. When the binary counter is activated this time, it will begin counting from a binary representation of 25% of the diagonal erase pulse count and then is compared with the output of the 50% counter register 14 by the comparator circuit 22. When the logic signal GE goes high, the actual count will only be 25% of the diagonal erase pulse count.

On the other hand, if it is desired to limit the number of erase pulses applied to 62.5% of the diagonal erase pulse count, then the three-bit code will be set to "101" in the mux control circuit 32 so as to cause only the signal L__EXE60 to go high. As a consequence, the mux control circuit will again cause 12.5% of the diagonal erase pulse count (outputs of the counter register 18) to be sent to the multiplexer 30. However, in order to obtain a negative 12.5%, all of the bits in the counter register 18 are inverted (inverter 1020) in the multiplexer 30. Then, the clock driver should be toggled once (which adds a binary "1" to the count of the binary counter). In other words, this is a 2's complement which is how a binary representation of a negative number is obtained. However, the actual pulse count is not important since the number of erase pulses could be over one hundred pulses. Thus, only the relative percentage is more meaningful. Consequently, in order to simplify the design, the extra clocking to add the binary "1" in the 2's complement method has been eliminated.

Thereafter, the outputs of the multiplexer are again pre-loaded into the inputs of the binary counter. When the binary counter is activated this time, it will start counting from a binary representation of −12.5% of the diagonal erase pulse count and then is compared with the output of the 50% register counter 14 by the comparator circuit 22. When the logic signal GE goes high, the actual count will be 62.5% of the diagonal erase pulse count.

Similarly, if it is desired to limit the total number of erased pulses applied to 75% of the diagonal erase pulse count, then the three-bit code will be set to "110" in the mux control circuit 32 so as to cause only the signal L_EXE70 to go high. The mux control circuit will cause 25% of the diagonal erase pulse count (outputs of counter register 16) to be sent to the multiplexer. The multiplexer will again invert all of the bits in the register counter 16 (inverter 1018 of FIG. 10) in order to obtain a negative 25%. These outputs of the multiplexer are again pre-loaded into the input of the binary counter. When the binary counter is activated this time, it will commence counting from a binary representation of −25% of the diagonal erase pulse count and then is compared with the output of the 50% counter register 14 by the comparator circuit 22. When the signal GE goes high, the actual count will be 75% of the diagonal erase pulse count.

From the foregoing detailed description, it can thus be seen that the present invention provides a tracking circuit for performing an erase verify/erase operation so as to prevent over-erasure in an array of Flash EEPROM memory cells. The tracking circuit includes a binary counter, counter registers, and a comparator circuit. The binary counter is used for counting the number of erase pulses during a normal erase verify/erase operation. The counter registers are used to store 50%, 25% and 12.5% of a diagonal erase pulse count corresponding to binary representations of the total number of clock pulses obtained from the binary counter during a diagonal erase verify operation. A multiplexer circuit selectively pre-loads the binary counter with a binary representation corresponding to one of a number of target counts prior to the normal erase verify/erase operation. The comparator circuit compares a pulse count obtained during the normal erase verify/erase operation and 50% of the diagonal erase pulse count from the counter register and generates a high logic signal when the pulse count equals the 50% of the diagonal erase pulse count to indicate that the target count has been reached.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A tracking circuit for performing an erase verify/erase operation so to prevent over-erasure in an array of Flash EEPROM memory cells, said tracking circuit comprising:

binary counter means responsive to clock pulses corresponding to erase pulses for counting the number of erase pulses during a normal erase verify/erase operation;

counter register means for storing 50%, 25%, and 12.5% of a diagonal erase pulse count corresponding to binary representations of the total number of said clock pulses obtained from said binary counter means during a diagonal erase verify operation;

said counter resister means including a first counter register for storing said 50% of the diagonal erase pulse count, a second counter resister for storing said 25% of the diagonal erase pulse count, and a third counter register for storing said 12.5% of the diagonal erase pulse count;

multiplexer circuit means responsive to said counter register means for selectively pre-loading said binary counter means with a binary representation corresponding to one of a number of target counts prior to the normal erase verify/erase operation; and comparator means responsive to said binary counter means and said counter register means for comparing a pulse count of said clock pulses obtained from the normal erase verify/erase operation and said 50% of the diagonal pulse count from said counter register means and for generating a high logic signal when said pulse count equals said 50% of the diagonal pulse count so as to indicate that said corresponding one of the number of target counts has been reached.

2. The tracking circuit as claimed in claim 1, wherein said binary counter means is a binary counter.

3. The tracking circuit as claimed in claim 1, wherein said 50% of the diagonal erase pulse count stored in said first counter register is obtained by shifting the binary representation of the total number of said clock pulses obtained from said binary counter means during the diagonal erase verify operation by one bit towards a least significant bit and subsequently loading the shifted binary representation into said first counter register.

4. The tracking circuit as claimed in claim 3, wherein said 25% of the diagonal erase pulse count stored in said second counter register is obtained by shifting the binary representation of the total number of said clock pulses obtained from said binary counter means during the diagonal erase verify operation by two bits towards a least significant bit and subsequently loading the shifted binary representation into said second counter register.

5. The tracking circuit as claimed in claim 4, wherein said 12.5% of the diagonal erase pulse count stored in said third counter register is obtained by shifting the binary representation of the total number of said clock pulses obtained from said binary counter means during the diagonal erase verify operation by three bits towards a least significant bit and subsequently loading the shifted binary representation into said third counter register.

6. The tracking circuit as claimed in claim 5, wherein said corresponding one of the number of target counts is one of 25%, 37.5%, 50%, 62.5%, and 75% of the diagonal erase pulse count.

7. The tracking circuit as claimed in claim 6, wherein said multiplexer circuit means causes said 25% of the diagonal erase pulse count from said second counter register to be pre-loaded into said binary counter means when said target count is 25%, causes said 12.5% of the diagonal erase pulse count from said third counter register to be pre-loaded into said binary counter means when said target count is 37.5%, and causes 0% of the diagonal erase pulse count from said first counter register to be pre-loaded into said binary counter means when said target count is 50%.

8. The tracking circuit as claimed in claim 7, wherein said multiplexer circuit means causes all of the bits in the binary representation of the 12.5% of the diagonal erase pulse count from the third counter register to be inverted in order to correspond to −12.5% and subsequently pre-loading the same into said binary counter means when said target count is 62.5% and causes all of the bits in the binary representation of the 25% of the diagonal erase pulse count from the second counter register to be inverted in order to correspond to −25% and subsequently pre-loading the same into said binary counter means when said target count is 75%.

9. The tracking circuit as claimed in claim 1, further comprising load register control circuit means for generating a load register signal for loading 50% of the diagonal erase pulse count into said first counter register.

10. The tracking circuit as claimed in claim 9, further comprising mux control circuit means for generating load multiplexer signals to pre-load said corresponding one of the number of target counts.

11. The tracking circuit as claimed in claim 1, further comprising clock driver means responsive to erase pulses for generating a corresponding one of said clock pulses for each erase pulse received.

12. A tracking circuit for performing an erase verify/erase operation so to prevent over-erasure in an array of Flash EEPROM memory cells, said tracking circuit comprising:

binary counter means responsive to clock pulses corresponding to erase pulses for counting the number of erase pulses during a normal erase verify/erase operation;

counter register means for storing 50%, 25%, and 12.5% of a diagonal erase pulse count corresponding to binary representations of the total number of said clock pulses obtained from said binary counter means during a diagonal erase verify operation;

counter resister means including a first counter register for storing said 50% of the diagonal erase pulse count, a second counter register for storing said 25% of the diagonal erase pulse count, and a third counter resister for storing said 12.5% of the diagonal erase pulse count;

load register control circuit means for generating a load register signal to cause said counter register means to be loaded with said 50%, 25%, and 12.5% of the diagonal erase pulse count;

multiplexer circuit means responsive to said counter register means for selectively pre-loading said binary counter means with a binary representation corresponding to one of a number of target counts prior to the normal erase verify/erase operation;

mux control circuit means for generating load multiplexer signals to cause said multiplexer circuit means to pre-load said binary counter means with the binary representation corresponding to one of the number of target counts; and comparator means responsive to said binary counter means and said counter register means for comparing a pulse count of said clock pulses obtained from the normal erase verify/erase operation and said 50% of the diagonal pulse count from said counter register means and for generating a high logic signal when said pulse count equals said 50% of the diagonal pulse count so as to indicate that said corresponding one of the number of target counts has been reached.

13. The tracking circuit as claimed in claim 12, wherein said corresponding one of the number of target counts is one of 25%, 37.5%, 50%, 62.5%, and 75% of the diagonal erase pulse count.

14. The tracking circuit as claimed in claim 13, wherein said multiplexer circuit means causes said 25% of the diagonal erase pulse count from said second counter register to be pre-loaded into said binary counter means when said target count is 25%, causes said 12.5% of the diagonal erase pulse count from said third counter register to be pre-loaded into said binary counter means when said target count is 37.5%, and causes 0% of the diagonal erase pulse count from said first counter register to be pre-loaded into said binary counter means when said target count is 50%.

15. The tracking circuit as claimed in claim 14, wherein said multiplexer circuit means causes all of the bits in the binary representation of the 12.5% of the diagonal erase pulse count from the third counter register to be inverted in order to correspond to −12.5% and subsequently pre-loading the same into said binary counter means when said target count is 62.5% and causes all of the bits in the binary representation of the 25% of the diagonal erase pulse count from the second counter register to be inverted in order to correspond to −25% and subsequently pre-loading the same into said binary counter means when said target count is 75%.

16. A tracking method for performing an erase verify/erase operation so to prevent over-erasure in an array of Flash EEPROM memory cells, said tracking method comprising the steps of;

counting the number of erase pulses during a normal erase verify/erase operation with a binary counter;

storing initially in first, second and third counter registers 50%, 25%, and 12.5% respectively of a diagonal erase pulse count corresponding to binary representations of the total number of said clock pulses during a diagonal erase verify operation;

selectively pre-loading the binary counter with a binary representation corresponding to one of a number of target counts prior to the normal erase verify/erase operation;

comparing a pulse count of the clock pulses obtained from the normal erase verify/erase operation with the 50% of the diagonal pulse count stored in the counter registers; and generating a high logic signal when the pulse count equals the 50% of the diagonal pulse count so as to indicate that the corresponding one of the number of target counts has been reached.

17. The tracking method as claimed in claim 16, wherein the step of selectively pre-loading includes the steps of loading said binary counter with 25% of the diagonal erase pulse count from the second counter register when the target count is 25%, loading said binary counter with 12.5% of the diagonal erase pulse count from the third counter register when the target count is 37.5%, and loading said binary counter with 0% of the diagonal erase pulse count from said first counter register when said target count is 50%.

18. A tracking circuit as claimed in claim 17, wherein the steps of selectively pre-loading further includes the steps of inverting all of the bits in the binary representation of the 12.5% of the diagonal erase pulse count from the third counter register in order to correspond to −12.5% and subsequently loading the same into said binary counter when the target count is 62.5% and inverting all of the bits in the binary representation of the 25% of the diagonal erase pulse count from the second counter register in order to correspond to −25% and subsequently loading the same into said binary counter when the target count is 75%.

* * * * *

UNITED STATES PATENT AND TRADEMARK OFFICE
CERTIFICATE OF CORRECTION

PATENT NO. : 6,301,159 B1
DATED : October 9, 2001
INVENTOR(S) : Feng Pan

Page 1 of 1

It is certified that error appears in the above-identified patent and that said Letters Patent is hereby corrected as shown below:

<u>Column 12,</u>
Lines 4 and 6, change "resister" to -- register --.

<u>Column 14,</u>
Line 55, change "A" to -- The --.

Signed and Sealed this

Twenty-sixth Day of March, 2002

Attest:

Attesting Officer

JAMES E. ROGAN
*Director of the United States Patent and Trademark Office*